United States Patent [19]
Lee

[11] Patent Number: 6,007,674
[45] Date of Patent: Dec. 28, 1999

[54] STABILIZING APPARATUS FOR A DRY ETCHER SYSTEM

[75] Inventor: Michael Lee, Hsinchu, Taiwan

[73] Assignee: Vanguard International Semiconductor Corporation, Taiwan

[21] Appl. No.: 08/965,098

[22] Filed: Nov. 6, 1997

[51] Int. Cl.⁶ .................................................. H05H 1/00
[52] U.S. Cl. .................................... 156/345; 315/111.21
[58] Field of Search ........................ 156/345; 315/111.21

[56] References Cited

U.S. PATENT DOCUMENTS 5,025,135   6/1991   Gesche et al. .......................... 156/345

Primary Examiner—Thi Dang
Attorney, Agent, or Firm—Christensen O'Connor Johnson & Kindness PLLC

[57] ABSTRACT

The present invention discloses a stabilizing apparatus for avoiding auto-resetting of a dry etcher system. The ripples of direct current are eliminated by applying capacitors connects across the testing points of the power supply. Auto-reset caused by the power supply is overcome to support a more stable electric power for the hard disk driver of the dry etcher system.

7 Claims, 3 Drawing Sheets

STABILIZING APPARATUS FOR A DRY ETCHER SYSTEM

FIELD OF THE INVENTION

The present invention relates to an apparatus for stabilizing operations of a Rainbow 4520 dry etcher system, and more particularly, to an apparatus for eliminating ripples of direct current that cause the Rainbow 4520 to auto-reset.

BACKGROUND OF THE INVENTION

Wet etching was the standard pattern transfer technique used to fabricate early generations of integrated circuits. Its widespread use arose because the technology of wet etching was well established and understood. Further, liquid etchant is available with very high selectively to both the substrate and the masking layer. However, wet etching processes are typically isotropic, which is unsuitable for many applications.

One alternative pattern transfer method that offers the capability of non-isotropic etching is dry etching. Dry etching also offers the important manufacturing advantage of eliminating the handling, consumption, and disposal of the relatively large quantities of dangerous acids and solvents used in wet etching and resist stripping processes. Dry etching and resist stripping operations use comparatively small amounts of chemicals.

The Rainbow 4520 manufactured by Lam Research Corp. is a machine that performs oxide, polysilicon, and nitride dry etching. The Rainbow 4520 is an older machine that has been in service for a number of years. One issue for the Rainbow 4520 is that through extended use, some elements of the Rainbow 4520 age and degrade. This degradation often manifests itself in the auto-resetting of the Rainbow 4520. As can be appreciated, this event will seriously adversely impact the operations of the Rainbow 4520. The auto-reset sequence causes a significant amount of downtime while the machine re-initializes, waits for temperature stabilization, and reassigns recipe parameters.

If the auto-reset occurs during a dry etch run, the conditions within the dry etch chamber will be uncontrolled, which will degrade the yield of the wafer, and furthermore, a great deal of wafers may be useless. Unfortunately, many spare parts for the Rainbow 4520 are not produced any more, which implies that repairs to those parts are now the user's responsibility. What is needed is an apparatus that prevents the auto-resetting of the Rainbow 4520.

SUMMARY OF THE INVENTION

A stabilizing apparatus for preventing a dry etcher system from auto-resetting by filtering ripples from the output voltage of the power supply of the dry etcher system.

In the preferred embodiment, the filters are capacitors connected in parallel to the output voltage of the power supply.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It has been found that the Rainbow 4520 dry etch machine periodically automatically resets. The frequency of this auto-resetting may vary from 2 or 3 times a day to 20 or 30 times a day. Attempts to determine the cause of the auto-resetting have centered around parts failure. One method used to determine the particular failing part is to systematically replace each electrical control part of the machine. Hardware equipment, such as the CPU, mother board, hard disk, even the interface cards are replaced. However, even with the systematic replacement of these parts, the cause of the auto-resetting was still indeterminate.

One element that cannot be substituted for is the power supply apparatus of the Rainbow 4520. This is because the power supply apparatus is no longer available for the Rainbow 4520. Though there can be no certainty that the power supply apparatus of the Rainbow 4520 is the cause of the auto-resetting, it has been detected that the voltage of its direct current output drops from 5.0 Volts to 4.2 Volts. This gives an indication as to one possible source of the auto-resetting.

Figure 1:
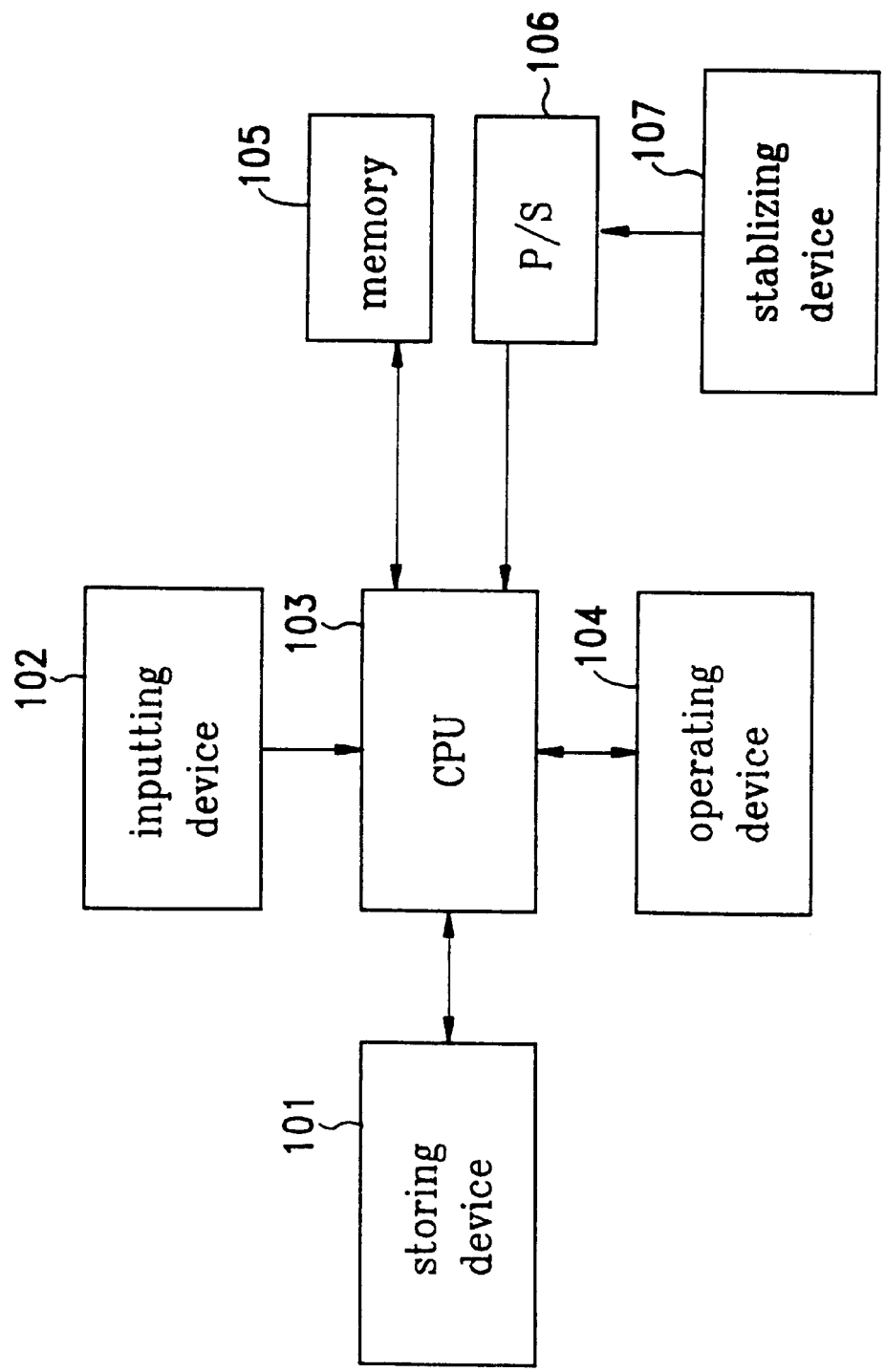
FIG. 1 is a functional block diagram of hardware components in the stabilizing apparatus for a dry etcher system according to the present invention.

FIG. 1 illustrates the functional block diagram of hardware components in a Rainbow 4520 including the stabilizing device 107 of the present invention. The Rainbow 4520 is equipped with a storing device 101, a CPU 103, an inputting device 102, an operating device 104, a memory 105 and a power supply 106. A stabilizing device 107 is connected to and is used to control power supply 106. The storing device 101 stores information for use by the Rainbow 4520, such as recipe parameters and the operating system of the Rainbow 4520. The inputting device 102 is a keypad and a mouse that is used to receive commands from human operators. The CPU 103 controls the overall operation of the Rainbow 4520. The operating device 104 is the device (typically a dry etch chamber) for performing the dry etching operations. The memory 105 stores temporary information for use by the Rainbow 4520. Finally, the power supply 106 provides electric power for the Rainbow 4520. These components of the Rainbow 4520 and their operation are well known in the art.

Figure 2A:
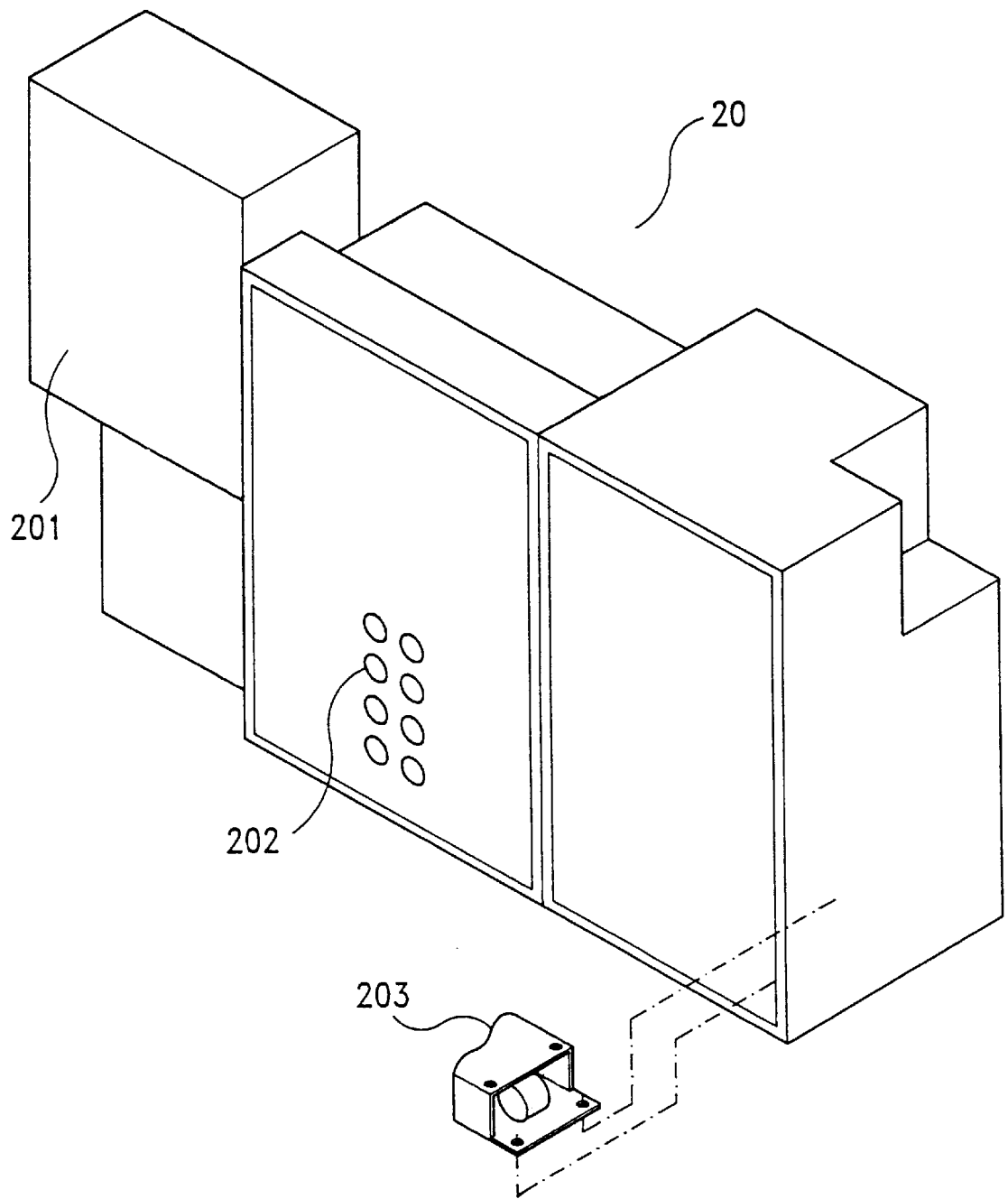
FIG. 2A is a perspective view of the Rainbow 4520 system.

FIG. 2A represents a perspective view of the Rainbow 4520 system 20, which encompasses a main chamber 201 (the operating device 104) for performing the dry etching operations, testing points 202 of the power supply 106 for detecting the electric power output, and a hard disk driver 203 for controlling hard disk operations. The testing points 202 are present in all power supplies 106 of the Rainbow 4520.

Figure 2B:
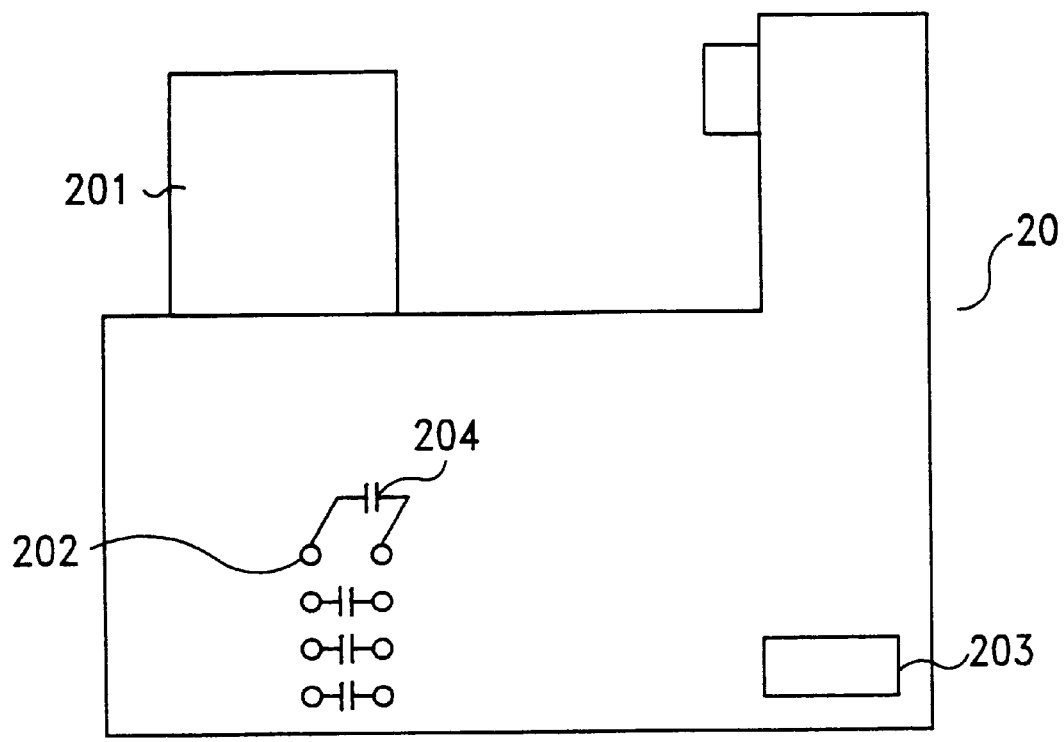
FIG. 2B is a back view of the Rainbow 4520 system.

Turning to FIG. 2B, the stabilizing device 107 is simply a set of capacitors 204 that are inserted into the testing points 202. The capacitors 204 are connected in parallel with the output voltage of the power supply 106. It has been found that when the capacitors 204 are connected across the testing points 202, auto-resetting does not occur. It is believed that the capacitors 204 eliminate DC ripples in the electric power output voltage. In the preferred embodiment, the capacitance value of each the capacitors 204 is 25 pF ($10^{-12}$ Faraday). However, it can be appreciated that the capacitance value may vary from 25 pF. Further, it is believed that any device that serves to eliminate ripples in the output voltage of power supply 106 would be effective in preventing auto-resetting.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A stabilizing apparatus for preventing a dry etcher system from auto-resetting, wherein said stabilizing apparatus comprises:

memory means for storing parameters of dry etching operations of said dry etcher system;

inputting means for receiving commands for starting an operation of said dry etcher system, and for adjusting recipe parameters of said dry etcher systems;

processing means for controlling said dry etching operations of said dry etcher system;

operating means for performing said dry etching operations;

power supplying means for supplying electric power having an output voltage to said dry etcher system; and filtering means for filtering ripples from the output voltage of said power supplying means.

2. The stabilizing apparatus according to claim 1, wherein said filtering means comprises a plurality of capacitors, each of said capacitor connected in parallel with said output voltage.

3. The stabilizing apparatus according to claim 2, wherein capacitance value of said capacitors is 25 pF ($10^{-12}$ Faraday).

4. The stabilizing apparatus of claim 1, wherein said dry etcher system includes an auto-reset means for resetting said dry etcher system, said auto-reset means being responsive to the output voltage of said power supplying means.

5. A stabilizing apparatus for preventing a dry etcher system from auto-resetting, said stabilizing apparatus comprising:

memory means for storing parameters of dry etching operations of said dry etcher system;

inputting means for receiving commands for starting an operation of said dry etcher system, and for adjusting recipe parameters of said dry etcher systems;

processing means for controlling said dry etching operations of said dry etcher system;

operating means for performing said dry etching operations;

power supplying means for supplying electric power having an output voltage to said dry etcher system;

auto-reset means responsive to said output voltage for auto-resetting said dry etcher system; and a plurality of capacitors, each said capacitor connected in parallel and receiving said output voltage.

6. The stabilizing apparatus according to claim 5, wherein the capacitance value of each said capacitor is 25 pF ($10^{-12}$ Faraday).

7. The stabilizing apparatus of claim 5 wherein said power supply includes test points and said plurality of capacitors are connected to said test points.

* * * * *